United States Patent
Lo et al.

(10) Patent No.: US 11,018,265 B1
(45) Date of Patent: May 25, 2021

(54) TRANSIENT-VOLTAGE-SUPPRESSION DIODE STRUCTURE AND MANUFACTURING METHOD THEREOF

(71) Applicant: Mosel Vitelic Inc., Hsinchu (TW)

(72) Inventors: Hsiu-Fang Lo, Hsinchu (TW); Yu-Hsuan Chang, Hsinchu (TW)

(73) Assignee: MOSEL VITELIC INC., Hsinchu (TW)

( * ) Notice: Subject to any disclaimer, the term of this patent is extended or adjusted under 35 U.S.C. 154(b) by 0 days.

(21) Appl. No.: 16/749,320

(22) Filed: Jan. 22, 2020

(30) Foreign Application Priority Data

Dec. 4, 2019 (TW) .................................. 108144225

(51) Int. Cl.
| | |
|---|---|
| *H01L 29/866* | (2006.01) |
| *H01L 21/26* | (2006.01) |
| *H01L 21/265* | (2006.01) |
| *H01L 29/66* | (2006.01) |
| *H01L 27/02* | (2006.01) |

(52) U.S. Cl.
CPC ...... *H01L 29/866* (2013.01); *H01L 21/26513* (2013.01); *H01L 27/0255* (2013.01); *H01L 29/66106* (2013.01)

(58) Field of Classification Search
CPC ............. H01L 29/866; H01L 21/26513; H01L 29/66106; H01L 27/0255
USPC ........................................................ 257/106
See application file for complete search history.

(56) References Cited

U.S. PATENT DOCUMENTS

| | | | |
|---|---|---|---|
| 8,377,757 B2 | 2/2013 | Hawe et al. | |
| 2004/0217425 A1* | 11/2004 | Brodsky | H01L 27/0248 257/360 |
| 2004/0262696 A1* | 12/2004 | Ronsisvalle | H03K 17/567 257/378 |
| 2005/0253216 A1* | 11/2005 | Tsuchiko | H01L 27/0629 257/491 |
| 2006/0006459 A1* | 1/2006 | Yoshikawa | H01L 27/0629 257/330 |

(Continued)

FOREIGN PATENT DOCUMENTS

| | | |
|---|---|---|
| TW | 200943554 A | 10/2009 |
| TW | 201622096 A | 6/2016 |

*Primary Examiner* — Sheikh Maruf
(74) *Attorney, Agent, or Firm* — Kirton McConkie; Evan R. Witt

(57) ABSTRACT

A transient-voltage-suppression diode structure and a manufacturing method thereof are disclosed. The structure includes a substrate, an N− type epitaxial layer, a first metal layer, a first N+ type implant layer, a deep N+ type implant layer and plural polycrystalline plugs. The N− type epitaxial layer is disposed on the substrate. The first metal layer is disposed on the N− type epitaxial layer to form a working-voltage terminal. The first N+ type implant layer spatially corresponding to the working-voltage terminal and embedded in the N− type epitaxial layer is connected with the working-voltage terminal. The deep N+ type implant layer spatially corresponding to the working-voltage terminal and embedded in the N− type epitaxial layer is spaced apart from the first N+ type implant layer at a separation distance. The plural polycrystalline plugs are connected between the working-voltage terminal of the first metal layer and the deep N+ type implant layer.

16 Claims, 13 Drawing Sheets

(56) References Cited

U.S. PATENT DOCUMENTS

| | | | |
|---|---|---|---|
| 2007/0145520 A1* | 6/2007 | Soma | H01L 27/0623 |
| | | | 257/506 |
| 2011/0198728 A1 | 8/2011 | Etter et al. | |
| 2012/0299108 A1* | 11/2012 | Harada | H01L 29/7395 |
| | | | 257/355 |
| 2013/0146941 A1* | 6/2013 | Andou | H01L 29/866 |
| | | | 257/140 |
| 2014/0167101 A1 | 6/2014 | Bobde et al. | |
| 2014/0231961 A1* | 8/2014 | Lin | H01L 29/735 |
| | | | 257/565 |
| 2015/0084125 A1* | 3/2015 | Paia | H01L 29/0878 |
| | | | 257/334 |
| 2015/0123236 A1* | 5/2015 | Lin | H01L 29/861 |
| | | | 257/487 |
| 2016/0141429 A1* | 5/2016 | Kim | H01L 29/6609 |
| | | | 257/106 |
| 2017/0077081 A1* | 3/2017 | Toyoda | H01L 29/7395 |
| 2017/0125584 A1* | 5/2017 | Zhang | H01L 29/0619 |

* cited by examiner

TRANSIENT-VOLTAGE-SUPPRESSION DIODE STRUCTURE AND MANUFACTURING METHOD THEREOF

FIELD OF THE INVENTION

The present disclosure relates to a diode structure, and more particularly to a transient-voltage-suppression diode structure and a manufacturing method thereof.

BACKGROUND OF THE INVENTION

A transient-voltage-suppression diode, also called as a TVS diode, is an electronic device used to protect electronics from voltage spikes induced on connected wires. In recent years, as the development of electronic systems has become more sophisticated, the demand for TVS device has become more and more urgent.

A conventional TVS device includes a Zener diode utilized to conduct the current when the device is collapsed, so that the current does not flow into the protected circuit. The Zener diode has characteristics such as large leakage current and large junction capacitance. For being applicable of the TVS device, the Zener diode tends to develop in low voltage applications.

FIG. 1 is a cross sectional view illustrating a conventional TVS diode structure. In the embodiment, a Zener diode is served as a protection mechanism for the transient-voltage-suppression device. As shown, the TVS device 1 includes a bottom metal layer 11 connected to a ground terminal GND, a P+ type base layer 12, an N type epitaxial layer 13, an N+ type buried layer 14, an N– type epitaxial layer 15, an interlayer dielectric (ILD) layer 16, a top metal layer 17 and a passivation layer 18 stacked sequentially. The top metal layer 17 is configured to form an input-and-output terminal I/O and a working-voltage terminal Vcc. An N+ type implant layer 20 and a P+ type implant layer 21 spatially corresponding to the input-and-output terminal I/O are embedded in the N– type epitaxial layer 15 and are connected to the input-and-output terminal I/O. An N+ type implant layer 22 and a deep N+ type implant layer 23 spatially corresponding to the working-voltage terminal Vcc are embedded in the N– type epitaxial layer 15 and are isolated through an oxide isolation portion 19. Notably, in the conventional TVS device 1, the voltage of the working-voltage terminal Vcc is related to the Zener diode constructed by the P+ type base layer 12 and the N type epitaxial layer 13. However, when the thickness of the N– type epitaxial layer 15 is very thick, it is difficult to increase the concentration of the N+ type implant layer 22 and the deep N+ type implant layer 23 by a general doping and drive-in procedure. Thus, it is difficult to obtain a Zener diode structure having a low breakdown voltage.

Therefore, there is a need of providing a transient-voltage-suppression diode structure and a manufacturing method thereof to address the above issues encountered by the prior arts and obtain a Zener diode structure having a low breakdown voltage.

SUMMARY OF THE INVENTION

An object of the present disclosure is to provide a transient-voltage-suppression diode structure and a manufacturing method thereof. By utilizing a plurality of polycrystalline plugs, it is beneficial to solve the problem that it is difficult to control and increase the concentration in the transient-voltage-suppression diode structure by the general doping and drive-in procedure. The structure of the polycrystalline plugs is helpful to reduce the distance of deep implantation and avoid the problem of concentration reduction after drive-in procedure.

The difficulty of the manufacturing process is reduced effectively. In addition, the structure of the plurality of polycrystalline plugs is further helpful to reduce the parasitic resistance of, for example the N– type epitaxial layer, so as to improve the performance of the transient-voltage-suppression diode structure.

In accordance with an aspect of the present disclosure, a transient-voltage-suppression diode structure is provided and includes a substrate, at least one N– type epitaxial layer, a first metal layer, a first N+ type implant layer, a deep N+ type implant layer and a plurality of polycrystalline plugs. The at least one N– type epitaxial layer is disposed on the substrate. The first metal layer is disposed on the at least one N– type epitaxial layer and is configured to form a working-voltage terminal. The first N+ type implant layer spatially corresponds to the working-voltage terminal and is embedded in the at least one N– type epitaxial layer. The first N+ type implant layer is configured to connect to the working-voltage terminal of the first metal layer. The deep N+ type implant layer spatially corresponds to the working-voltage terminal and is embedded in the at least one N– type epitaxial layer. The deep N+ type implant layer is spaced apart from the first N+ type implant layer at a separation distance. The plurality of polycrystalline plugs spatially corresponds to the working-voltage, are embedded in the at least one N– type epitaxial layer, and pass through the first N+ type implant layer. Each polycrystalline plug includes a first end and a second end opposite to each other. The first end is in contact with the working-voltage terminal, and the second end at least partially passes through the deep N+ type implant layer and is in contact with the deep N+ type implant layer.

In an embodiment, the substrate includes a P+ type base layer and an N type epitaxial layer. The N type epitaxial layer is disposed on the P+ type base layer and connected to the at least one N– type epitaxial layer.

In an embodiment, the substrate further includes a second metal layer connected to the P+ type base layer and opposite to the first metal layer, wherein the second metal layer is configured to form a ground terminal.

In an embodiment, the transient-voltage-suppression diode structure further includes an interlayer dielectric layer disposed between the at least one N– type epitaxial layer and the first metal layer.

In an embodiment, the first metal layer is further configured to form an input-and-output terminal, and the transient-voltage-suppression diode structure further includes a second N+ type implant layer and a P+ type implant layer embedded in the at least one N– type epitaxial layer, respectively. The input-and-output terminal passes through the interlayer dielectric layer and is connected to the second N+ type implant layer and the P+ type implant layer, respectively.

In an embodiment, the transient-voltage-suppression diode structure further includes an N+ type buried layer disposed between the N type epitaxial layer and the at least one N– type epitaxial layer. The N+ type buried layer spatially corresponds to the P+ type implant layer and the plurality of polycrystalline plugs.

In an embodiment, the transient-voltage-suppression diode structure further includes a passivation layer disposed on the first metal layer and partially exposing the first metal layer to define the working-voltage terminal and the input-and-output terminal.

In an embodiment, at least one oxide isolation portion is disposed between the second N+ type implant layer and the P+ type implant layer. The at least one oxide isolation portion passes through the at least one N− type epitaxial layer, the N type epitaxial layer and a part of the P+ type base layer.

In accordance with another aspect of the present disclosure, a manufacturing method of a transient-voltage-suppression diode structure is provided and incudes steps of: (a) providing a substrate; (b) forming at least one N− type epitaxial layer disposed on the substrate; (c) forming a first N+ type implant layer embedded in the at least one N− type epitaxial layer; (d) partially etching the at least one N− type epitaxial layer and the first N+ type implant layer to form a plurality of trenches passing through the first N+ type implant layer and a part of the at least one N− type epitaxial layer; (e) forming a deep N+ type implant layer embedded in the at least one N− type epitaxial layer and spaced apart from the first N+ type implant layer at a separation distance; (f) filling the plurality of trenches with a polycrystalline material to form a plurality of polycrystalline plugs, which are embedded in the at least one N− type epitaxial layer and pass through the first N+ implant layer; and (g) forming a first metal layer disposed on the at least one N− type epitaxial layer, wherein a part of the first metal layer spatially corresponding to the first N+ type implant layer, the plurality of crystalline plugs and the deep N+ type implant layer is configured to form a working-voltage terminal, wherein each polycrystalline plug comprises a first end and a second end opposite to each other, wherein the first end is in contact with the working-voltage terminal, and the second end at least partially passes through the deep N+ type implant layer and is in contact with the deep N+ type implant layer.

In an embodiment, the step (b) further includes a step of (b0) forming an N+ type buried layer, wherein the N+ type buried layer is disposed between the substrate and the at least one N− type epitaxial layer.

In an embodiment, the step (c) further includes a step of (c0) forming a second N+ type implant layer and a P+ type implant layer, respectively, which are embedded in the at least one N− type epitaxial layer, wherein a part of the first metal layer spatially corresponding to the second N+ type implant layer and the P+ type implant layer is configured to form an input-and-output terminal, wherein the input-and-output terminal passes through an interlayer dielectric layer and is connected to the second N+ type implant layer and the P+ type implant layer, respectively.

In an embodiment, the manufacturing method of the transient-voltage-suppression diode structure further includes a step of (h) forming a passivation layer disposed on the first metal layer and partially exposing the first metal layer to define the working-voltage terminal and the input-and-output terminal.

In an embodiment, the substrate includes a P+ type base layer and an N type epitaxial layer, wherein the N type epitaxial layer is disposed on the P+ type base layer and connected to the at least one N− type epitaxial layer.

In an embodiment, the step (d) further includes a step of (d0) partially etching the at least one N− type epitaxial layer and the substrate and filling with an oxide material to form at least one oxide isolation portion, wherein the at least one oxide isolation portion passes through the at least one N− type epitaxial layer, the N type epitaxial layer and a part of the P+ type base layer.

In an embodiment, the step (d) further includes a step of (d1) forming an interlayer dielectric layer disposed on the at least one N− type epitaxial layer.

In an embodiment, the manufacturing method of the transient-voltage-suppression diode structure further includes a step of (i) forming a second metal layer connected to the P+ type base layer, wherein the second metal layer is opposite to the first metal layer and is configured to form a ground terminal.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It should be noted that the following descriptions of preferred embodiments of this disclosure are presented herein for purpose of illustration and description only. It is not intended to be exhaustive or to be limited to the precise form disclosed.

Figure 1:
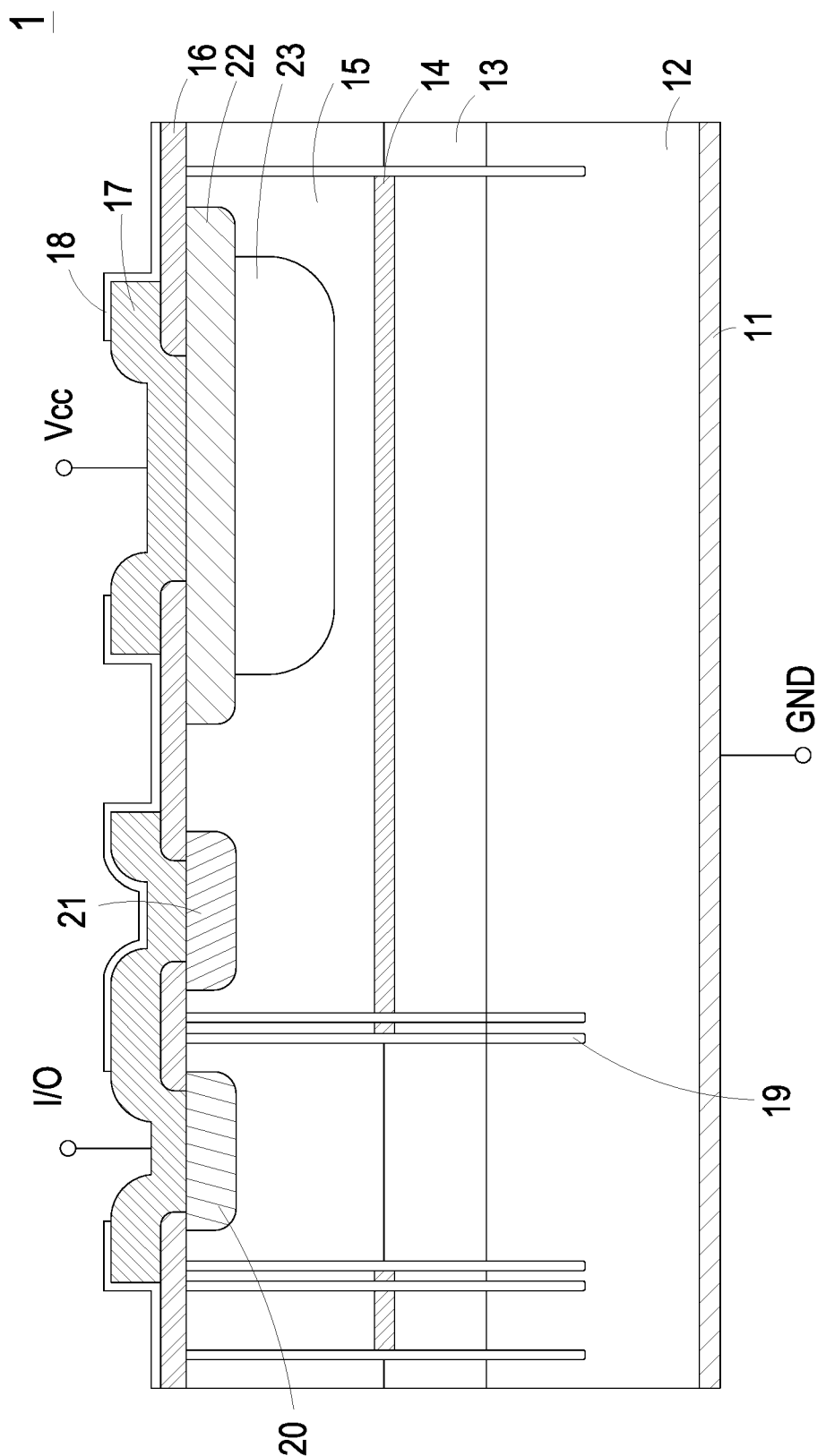
FIG. 1 is a cross sectional view illustrating a conventional TVS diode structure.
Figure 2:
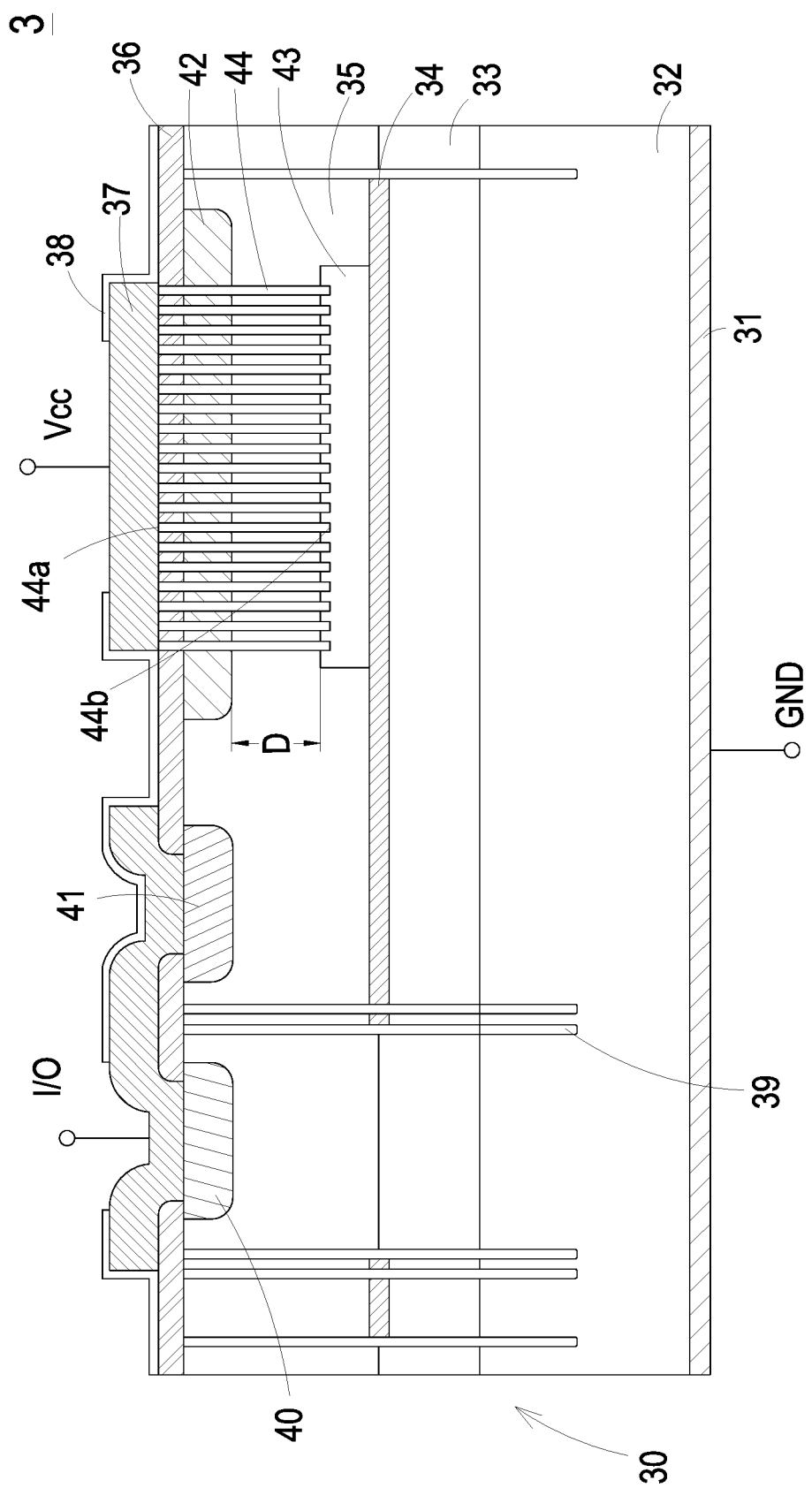
FIG. 2 is a cross sectional view illustrating a transient-voltage-suppression diode structure according to an embodiment of the present disclosure.

FIG. 2 is a cross sectional view illustrating a transient-voltage-suppression diode structure according to an embodiment of the present disclosure. In the embodiment, the transient-voltage-suppression diode structure 3 includes a substrate 30, at least one N− type epitaxial layer 35, a first metal layer 37, a first N+ type implant layer 42, a deep N+ type implant layer 43 and a plurality of polycrystalline plugs 44. The at least one N− type epitaxial layer 35 is disposed on the substrate 30. Preferably but not exclusively, in the embodiment, the substrate 30 includes a P+ type base layer 32 and an N type epitaxial layer 33. The N type epitaxial layer 33 is disposed on the P+ type base layer 32 and connected to the at least one N− type epitaxial layer 35. In addition, the transient-voltage-suppression diode structure 3 further includes an N+ type buried layer 34 disposed between the N type epitaxial layer 33 and the at least one N− type epitaxial layer 35. The first metal layer 37 is disposed on the at least one N− type epitaxial layer 35 and is configured to form a working-voltage terminal Vcc and an input-and-output terminal I/O, respectively. In the embodiment, the transient-voltage-suppression diode structure 3 further includes an interlayer dielectric layer 36 disposed between the first metal layer 37 and the at least one N− type epitaxial layer 35.

In the embodiment, the transient-voltage-suppression diode structure 3 further includes a passivation layer 38 disposed on the first metal layer 37 and partially exposing the first metal layer 37 to define the working-voltage terminal Vcc and the input-and-output terminal I/O, respectively. Certainly, the present disclosure is not limited thereto. In the embodiment, the structures of the first N+ type implant layer 42, the deep N+ type implant layer 43 and the plurality of polycrystalline plugs 44 are all corresponding to the working-voltage terminal Vcc of the first metal layer 37. Preferably but not exclusively, the first N+ type implant layer 42 spatially corresponding to the working-voltage terminal Vcc is embedded in the at least one N− type epitaxial layer 35, to connect to the working-voltage terminal Vcc of the first metal layer 37. The deep N+ type implant layer 43 spatially corresponding to the working-voltage terminal Vcc is embedded in the at least one N− type epitaxial layer 35, and is connected with the N+ type buried layer 34. Moreover, the deep N+ type implant layer 43 is spaced apart from the first N+ type implant layer 42 at a separation distance D. In other words, comparing to the first N+ type implant layer 42, the deep N+ type implant layer 43 is further embedded in the at least one N− type epitaxial layer 35 with a depth equal to the separation distance D, and is connected to the N+ type buried layer 34.

Notably, the plurality of polycrystalline plugs 44 spatially correspond to the working-voltage terminal Vcc of the first metal layer 37 and are embedded in the at least one N− type epitaxial layer 35. Moreover, the plurality of polycrystalline plugs 44 pass through the interlayer dielectric layer 36 and the first N+ type implant 42. In the embodiment, each polycrystalline plug 44 includes a first end 44a and a second end 44b opposite to each other. The first end 44a is in contact with the working-voltage terminal Vcc, and the second end 44b at least partially passes through the deep N+ type implant layer 43 and is in contact with the deep N+ type implant layer 43. Since the structure of the plurality of polycrystalline plugs 44 pass through the first N+ implant layer 42, it is beneficial to control and increase the concentration of the deep N+ type implant layer 43 relative to the at least one N− type epitaxial layer 35 by a general doping and drive-in procedure, so as to obtain a Zener diode structure having a low breakdown voltage. In addition, the deep N+ type implant layer 43 is further electrically connected through the plurality of polycrystalline plugs 44, and it is beneficial to reduce the parasitic resistance of the at least one N− type epitaxial layer 35. Namely, by utilizing a plurality of polycrystalline plugs 44, it is beneficial to solve the problem that it is difficult to control and increase the concentration for example of the deep N+ type implant layer 43 in the transient-voltage-suppression diode structure 3 by the general doping and drive-in procedure. At the same time, the structure of the polycrystalline plugs 44 is helpful to reduce the distance of deep implantation for the deep N+ type implant layer 43, and avoid the problem of concentration reduction after drive-in procedure. The difficulty of the manufacturing process is reduced effectively. In addition, the structure of the plurality of polycrystalline plugs 44 is further helpful to reduce the parasitic resistance of, for example the at least one N− type epitaxial layer 35, so as to improve the performance of the transient-voltage-suppression diode structure 3.

In the embodiment, the substrate 30 further includes a second metal layer 31 connected to the P+ type base layer 32 and opposite to the first metal layer 37. The second metal layer 31 is configured to form a ground terminal GND. On the other hand, it is noted that the transient-voltage-suppression diode structure 3 further includes a second N+ type implant layer 40 and a P+ type implant layer 41 spatially corresponding to the input-and-output terminal I/O of the first metal layer 37. The second N+ type implant layer 40 and the P+ type implant layer 41 are embedded in the at least one N− type epitaxial layer 35, respectively. The input-and-output terminal I/O passes through the interlayer dielectric layer 36 and is connected to the second N+ type implant layer 40 and the P+ type implant layer 41, respectively. Moreover, the N+ type buried layer 34 spatially corresponds to the P+ implant layer 41 and the plurality of polycrystalline plugs 44. In the embodiment, at least one oxide isolation portion 39 is disposed between the second N+ type implant layer 40 and the P+ type implant layer 41. The at least one oxide isolation portion 39 passes through the at least one N− type epitaxial layer 35, the N type epitaxial layer 33 and a part of the P+ type base layer 32. In addition, preferably but not exclusively, the at least one oxide isolation portion 39 is served as a boundary to define the transient-voltage-suppression diode structure 3. It is not an essential feature to limit the present disclosure, and not redundantly described herein. Notably, the numbers and the arrangement of the P+ type implant layer 41, the second N+ type implant layer 40, the plurality of polycrystalline plugs 44 and the oxide isolation portion 39 are adjustable according to the practical requirements. The present disclosure is not limited thereto.

Figure 3A:
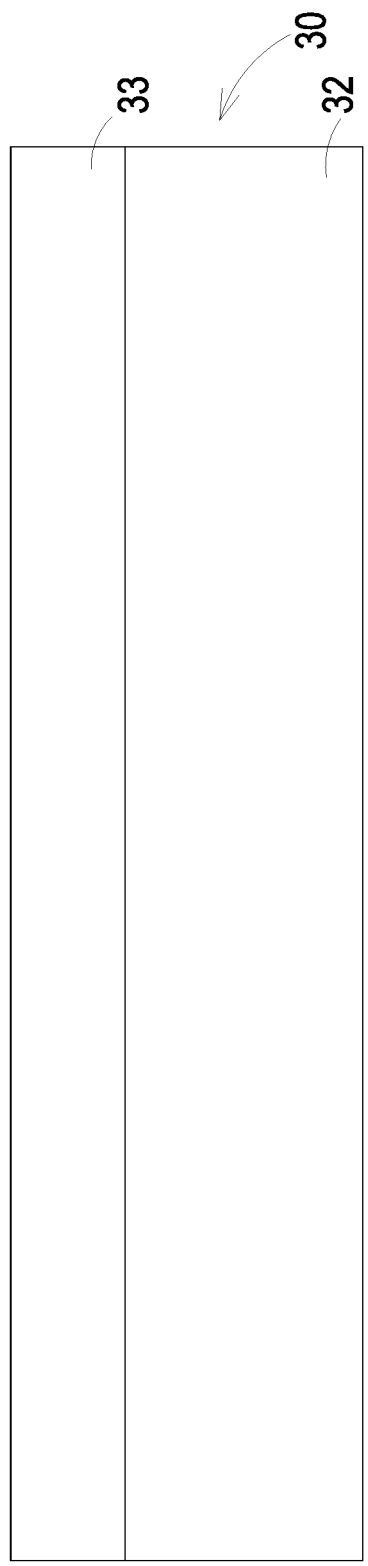
FIGS. 3A to 3I are cross sectional views illustrating the transient-voltage-suppression diode structure at several manufacturing stages according to the embodiment of the present disclosure.
Figure 3B:
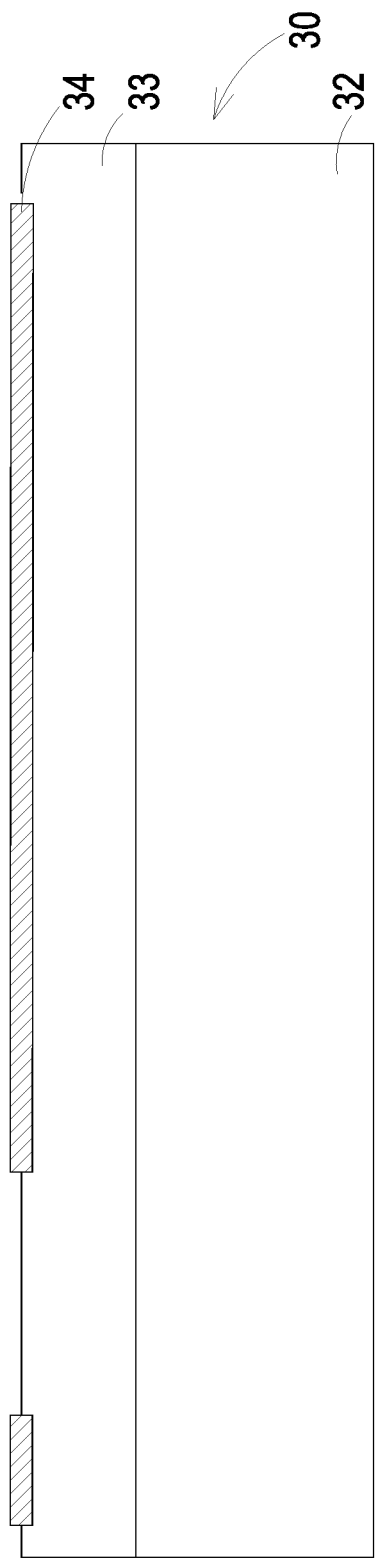
Figure 3C:
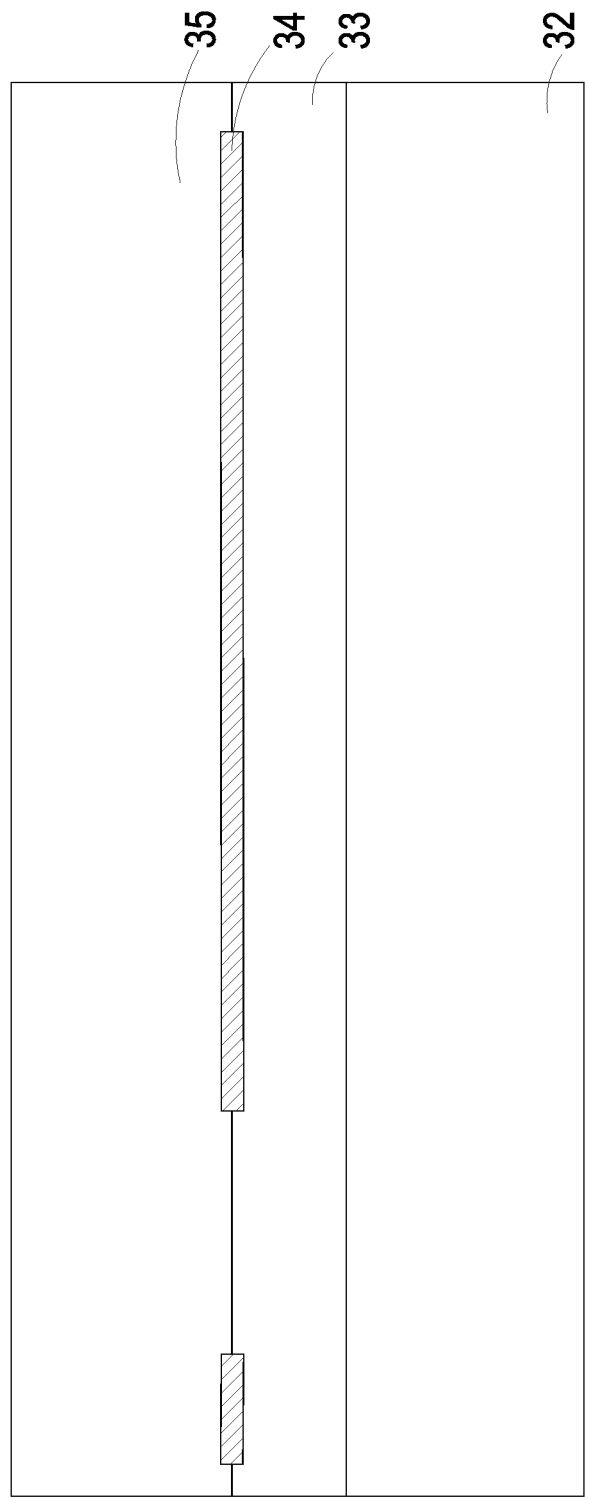

According to the aforementioned transient-voltage-suppression diode structure 3, the present disclosure also discloses a manufacturing method of the transient-voltage-suppression diode structure 3. FIGS. 3A to 3I are cross sectional views illustrating the transient-voltage-suppression diode structure at several manufacturing stages according to the embodiment of the present disclosure. FIGS. 4A and 4B are a flow chart showing a manufacturing method of a transient-voltage-suppression diode structure according to an embodiment of the present disclosure. Please refer to FIGS. 2, 3A to 3I and FIGS. 4A and 4B. Firstly, in the step S1, a substrate 30 is provided. As shown in FIG. 3A, the substrate 30 includes a P+ type base layer 32 and an N type epitaxial layer 33. The N type epitaxial layer 33 is disposed on the P+ type base layer 32. Then, in the step S2, an N+ type buried layer 34 is formed on the N type epitaxial layer 33 by for example but not limited to an implantation and drive-in procedure, as shown in FIG. 3B. In the step S3, at least one N− type epitaxial layer 35 is formed and disposed on the N type epitaxial layer 33 of the substrate 30, so that the N+ type buried layer 34 is disposed between the N type epitaxial layer 33 of the substrate and the at least one N− type epitaxial layer 35, and the N type epitaxial layer 33 is connected to the at least one N− type epitaxial layer 35, as shown in FIG. 3C.

Figure 3D:
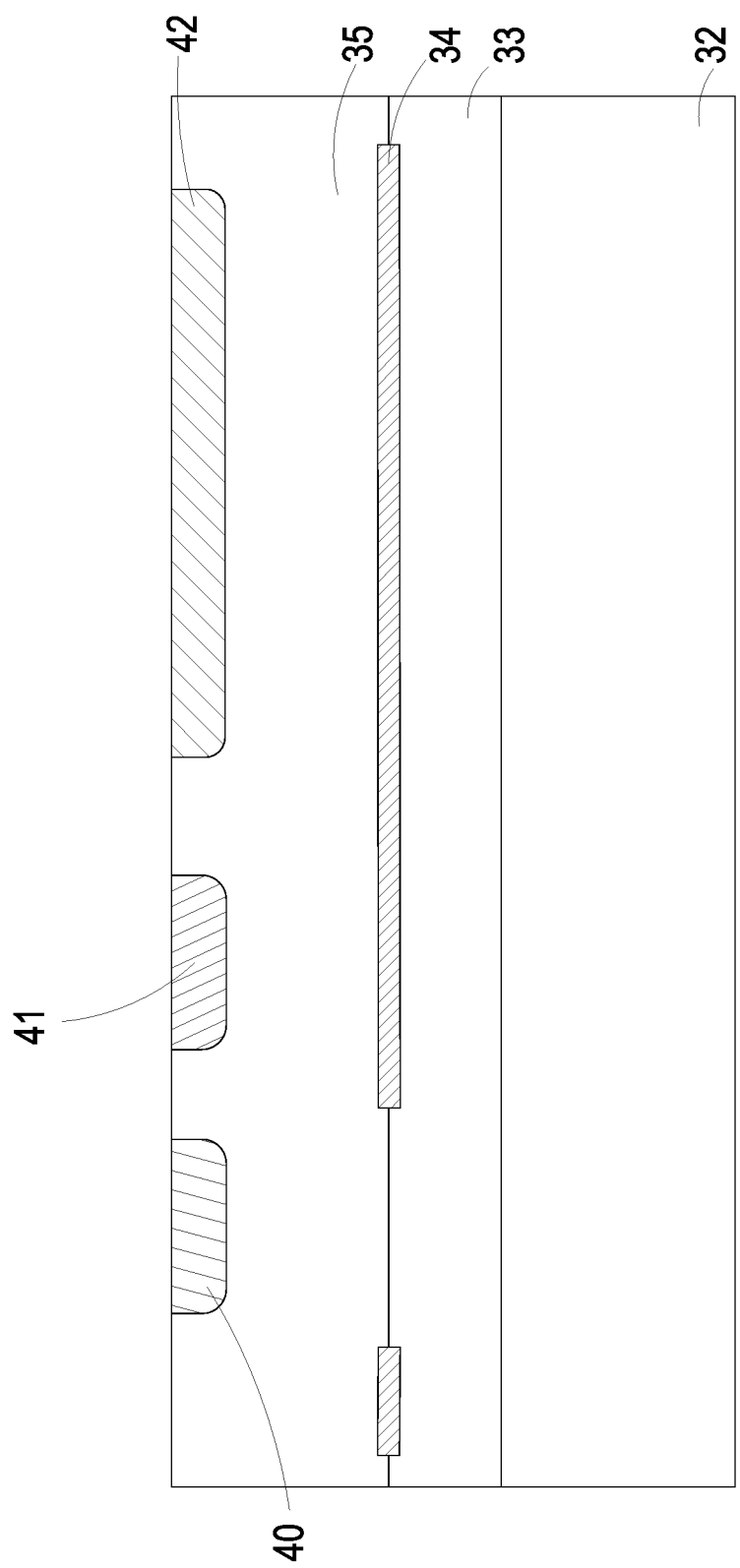
Figure 3E:
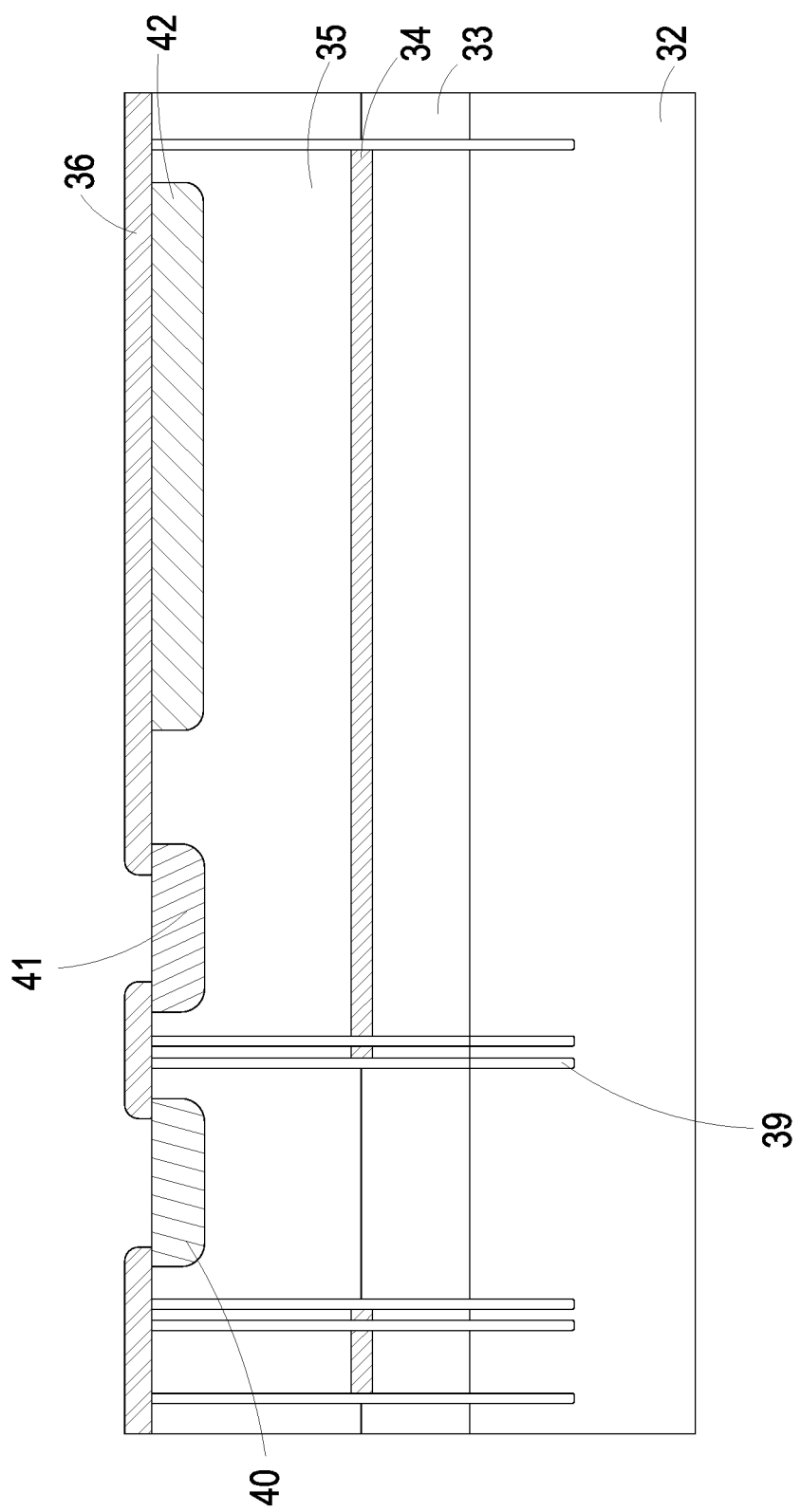
Figure 4A:
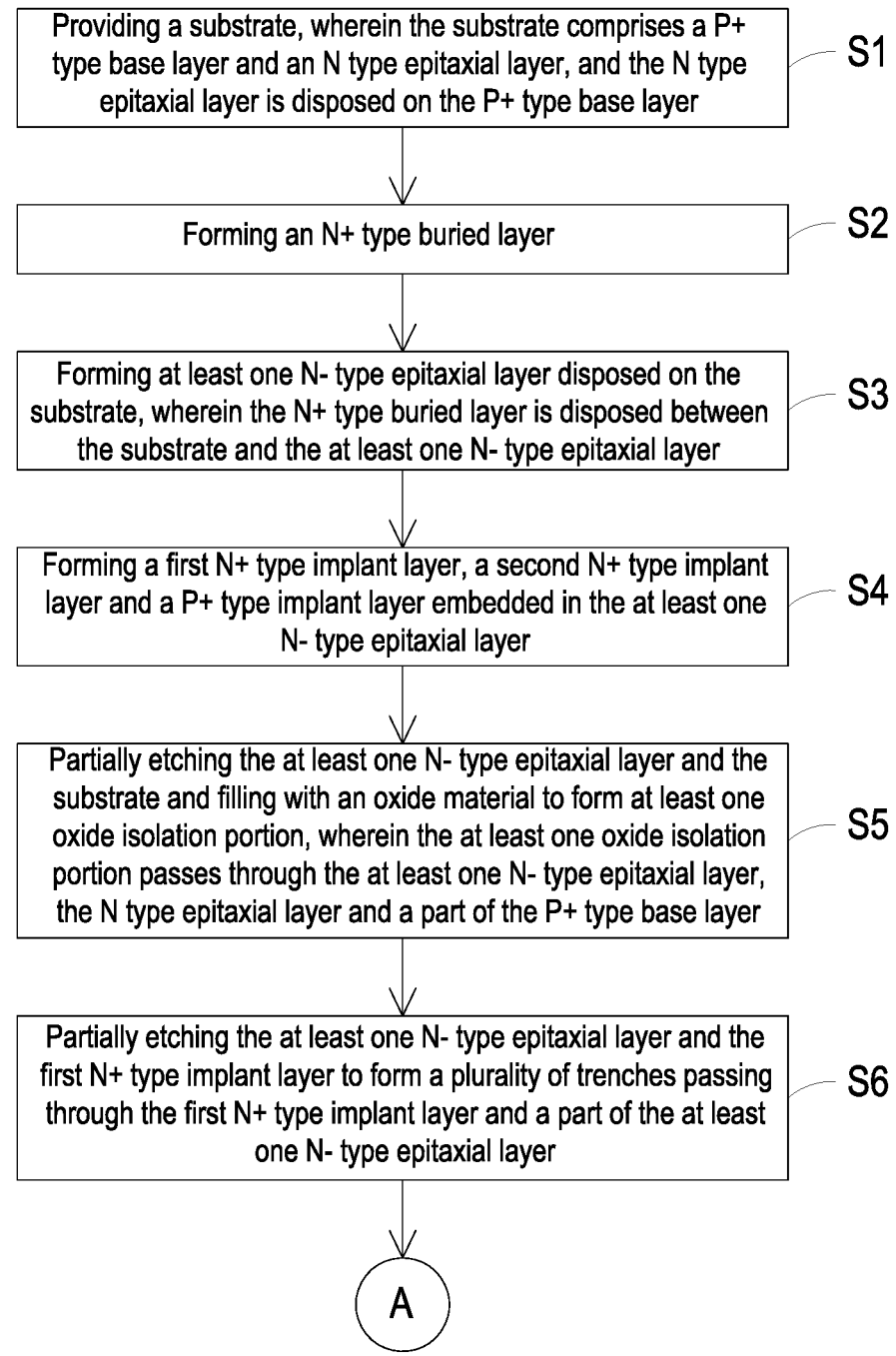
FIGS. 4A and 4B are a flow chart showing a manufacturing method of a transient-voltage-suppression diode structure according to an embodiment of the present disclosure.
Figure 4B:
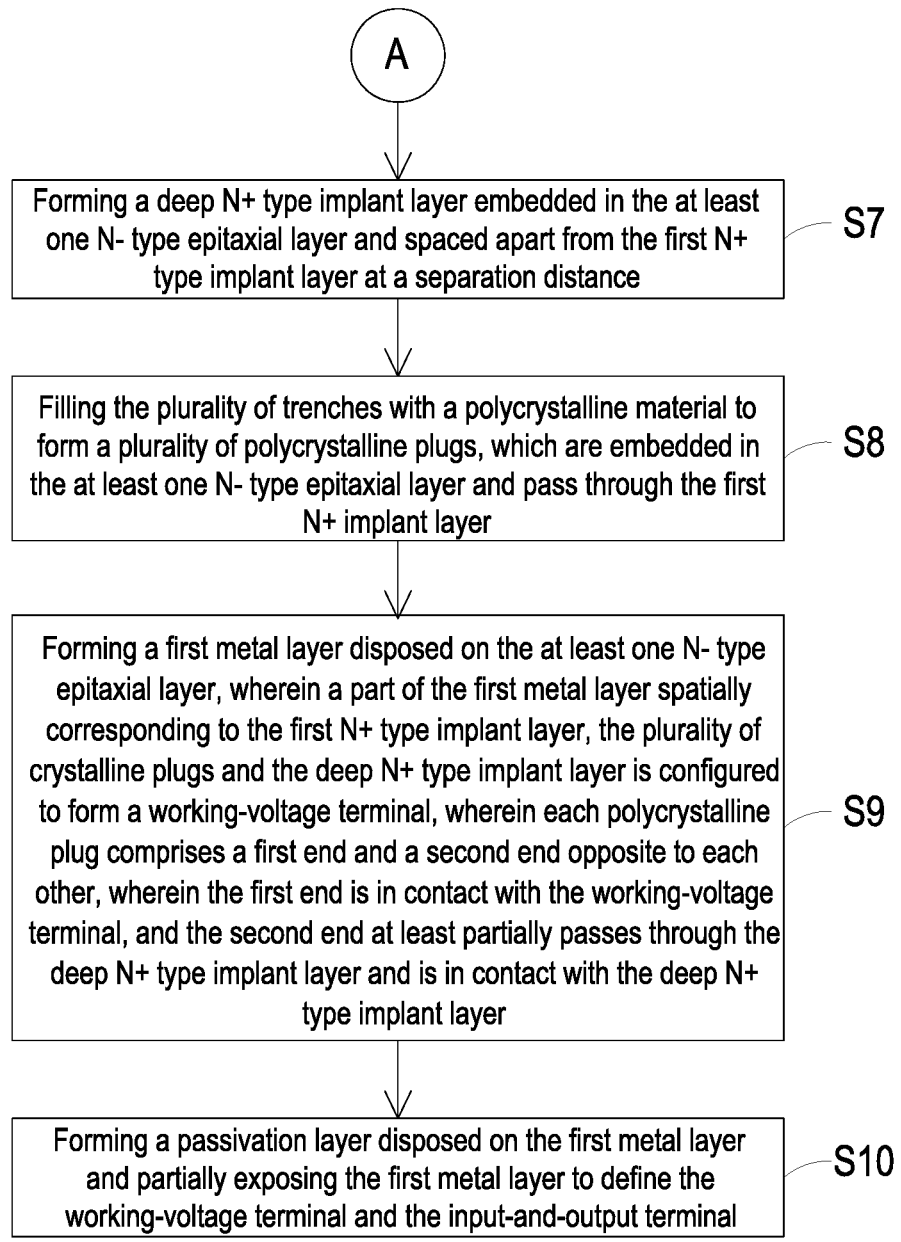

Thereafter, in the step S4, a first N+ type implant layer 42, a second N+ type implant layer 40 and a P+ type implant layer 41 are formed in the at least one N− type epitaxial layer 35 by for example but not limited to an implantation procedure, respectively, so as to be embedded in the at least one N− type epitaxial layer 35, as shown in FIG. 3D. In the embodiment, the first N+ type implant layer 42 spatially corresponds to a working-voltage terminal Vcc. The second N+ type implant layer 40 and the P+ type implant layer 41 spatially correspond to an input-and-output terminal I/O (referred to FIG. 2). In the step S5, both of the at least one N− type epitaxial layer 35 and the substrate 30 are partially etched by an etching procedure and an oxide material is filled, so as to form at least one oxide insulation portion 39, as shown in FIG. 3E. Preferably but not exclusively, in the embodiment, the at least one oxide insulation portion 39 passes through the at least one N− type epitaxial layer 35, the N+ type buried layer 34, the N type epitaxial layer 33 and a part of the P+ type base layer 32. Moreover, in the embodiment, an interlayer dielectric layer 36 is further formed on the at least one N− type epitaxial layer 35. The interlayer dielectric layer 36 is formed to define the connection regions of the first N+ type implant layer 42, the second N+ type implant layer 40 and the P+ type implant layer 41. The present disclosure is not limited thereto and not redundantly described herein.

Figure 3F:
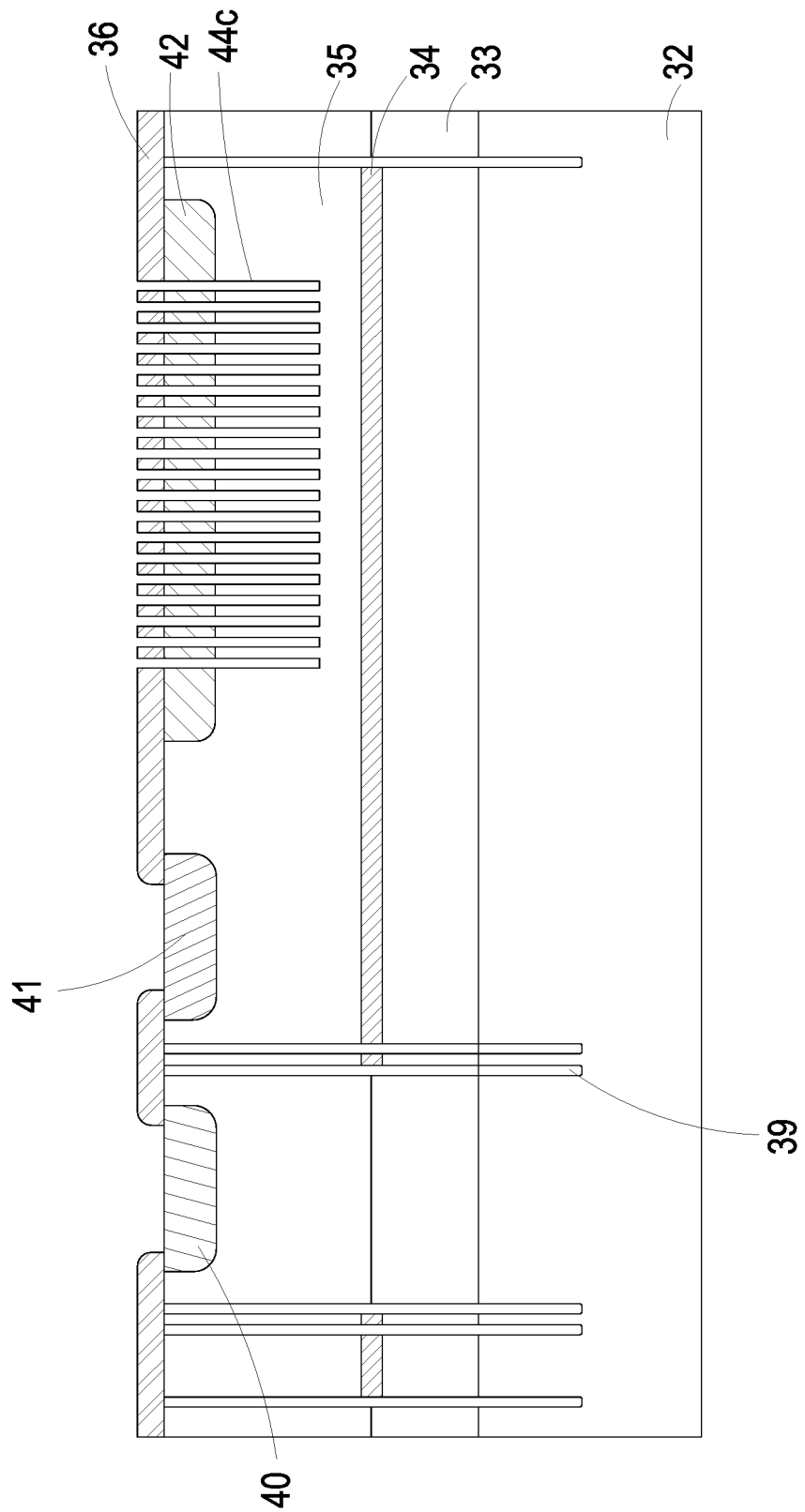
Figure 3G:
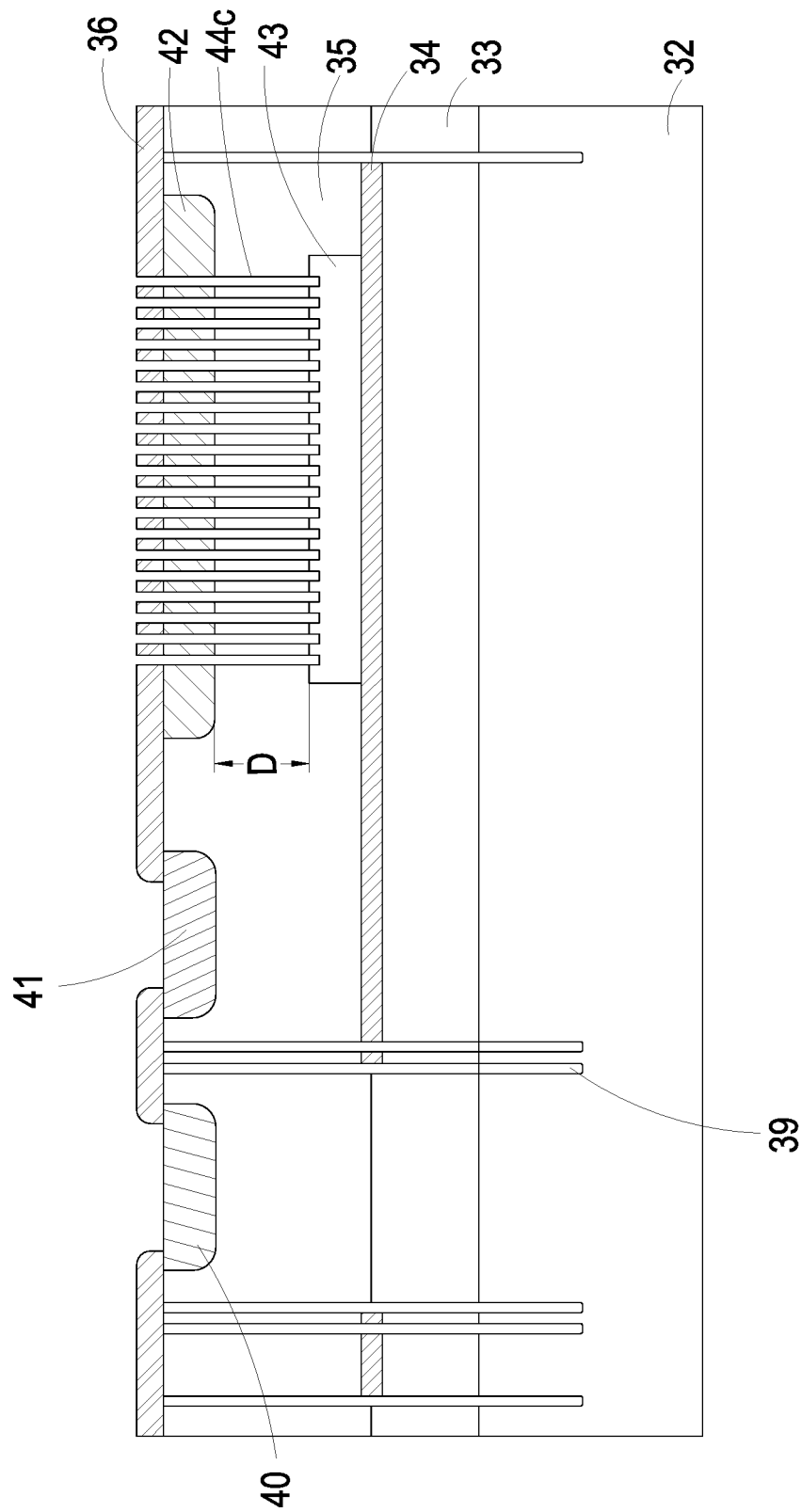
Figure 3H:
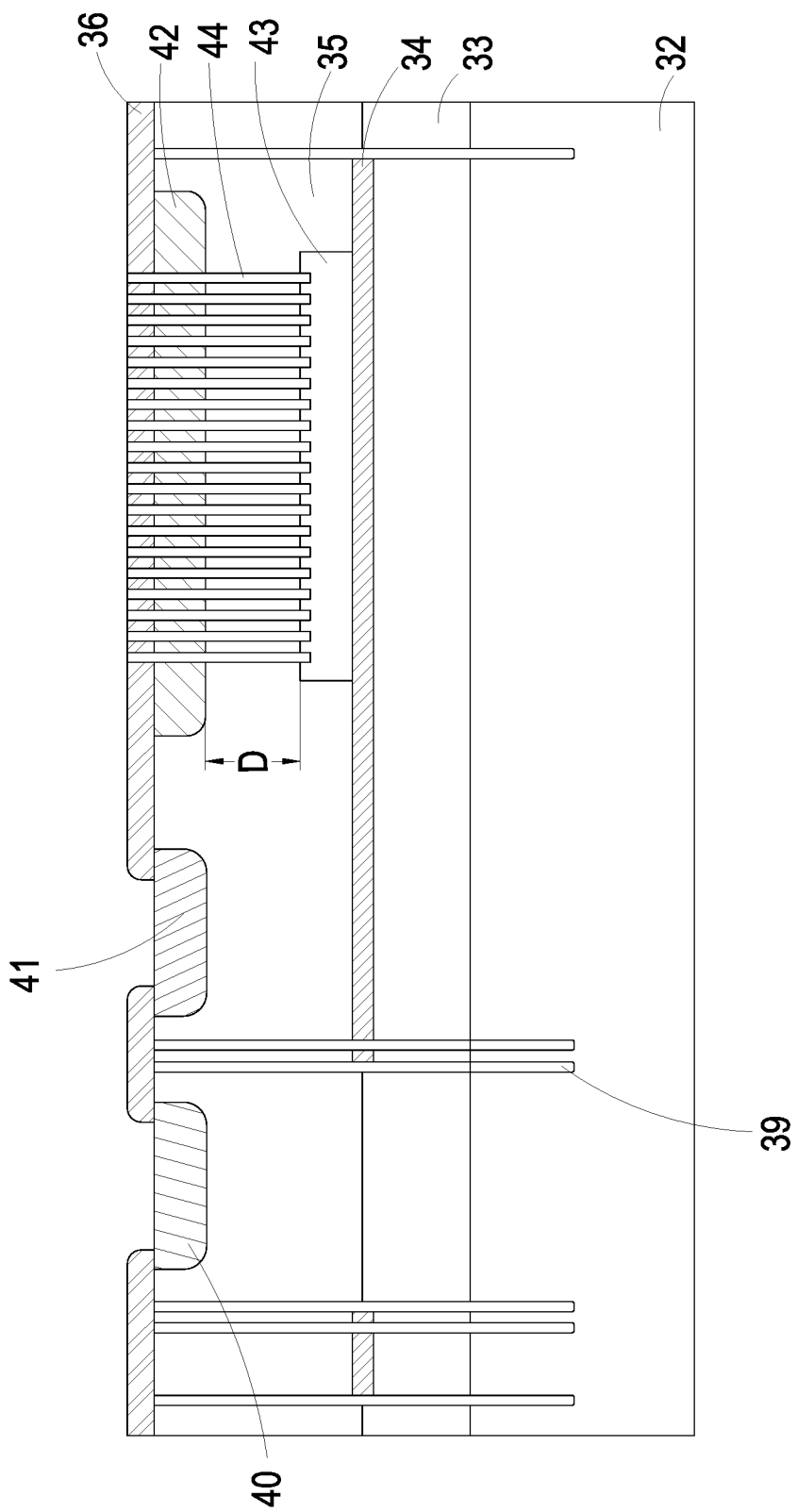

Then, in the step S6, both of the at least one N-type epitaxial layer 35 and the first N+ type implant layer 42 are partially etched by an etching procedure to form a plurality of trenches 44c passing through the first N+ type implant layer 42 and a part of the at least one N− type epitaxial layer 35, as shown in FIG. 3F. In the step S7, an implantation procedure is performed through the plurality of trenches 44c, and a deep N+ type implant layer 43 is formed at the bottom end of the plurality of trenches 44c. Consequently, the deep N+ type implant layer 43 is embedded in the at least one N− type epitaxial layer 35 and is spaced apart from the first N+ type implant layer 42 at a separation distance D, as shown in FIG. 3G. Notably, since the implantation procedure is performed through the plurality of trenches 44c, it is helpful to reduce the distance of deep implantation for the deep N+ type implant layer 43, and solves the problem of controlling and increasing the implant concentration. At the same time, the problem of concentration reduction after drive-in procedure is avoided. The difficulty of the manufacturing process is reduced effectively. Thereafter, in the step S8, the plurality of trenches are filled with a polycrystalline material to form a plurality of polycrystalline plugs 44, which are embedded in the at least one N− type epitaxial layer 35 and pass through the first N+ implant layer 42, as shown in FIG. 3H. Preferably but not exclusively, in the embodiment, a drive-in procedure for the deep N+ type implant layer 43, the first N+ type implant layer 42, the second N+ type implant layer 40 and P+ type implant layer 41 is performed after the plurality of polycrystalline plugs 44 are formed. The present disclosure is not limited thereto. It is noted that the plurality of polycrystalline plugs 44 are connected between the deep N+ type implant layer 43 and the first N+ implant layer 42, it is helpful to reduce the parasitic resistance of the at least one N− type epitaxial layer 35, so as to improve the performance of the transient-voltage-suppression diode structure 3.

Finally, in the step S9, a first metal layer 37 is formed and disposed on the at least one N− type epitaxial layer and the interlayer dielectric layer 36. In the embodiment, a part of the first metal layer 37 spatially corresponding to the first N+ implant layer 42, the plurality of polycrystalline plugs 44 and the deep N+ type implant layer 43 is configured to form the working-voltage terminal Vcc. In the embodiment, each polycrystalline plug 44 includes a first end 44a and a second end 44b opposite to each other. The first end 44a is in contact with the working-voltage terminal Vcc, and the second end 44b at least partially passes through the deep N+ type implant layer 43 and is in contact with the deep N+ type implant layer 43. In other embodiment, the interlayer dielectric layer 36 is formed before the first metal layer 37, so as to define the connection regions of the first metal layer 37, which are connected to the first N+ type implant layer 42, the second N+ type implant layer 40 and the P+ type implant layer 41. The present disclosure is not limited thereto.

Figure 3I:
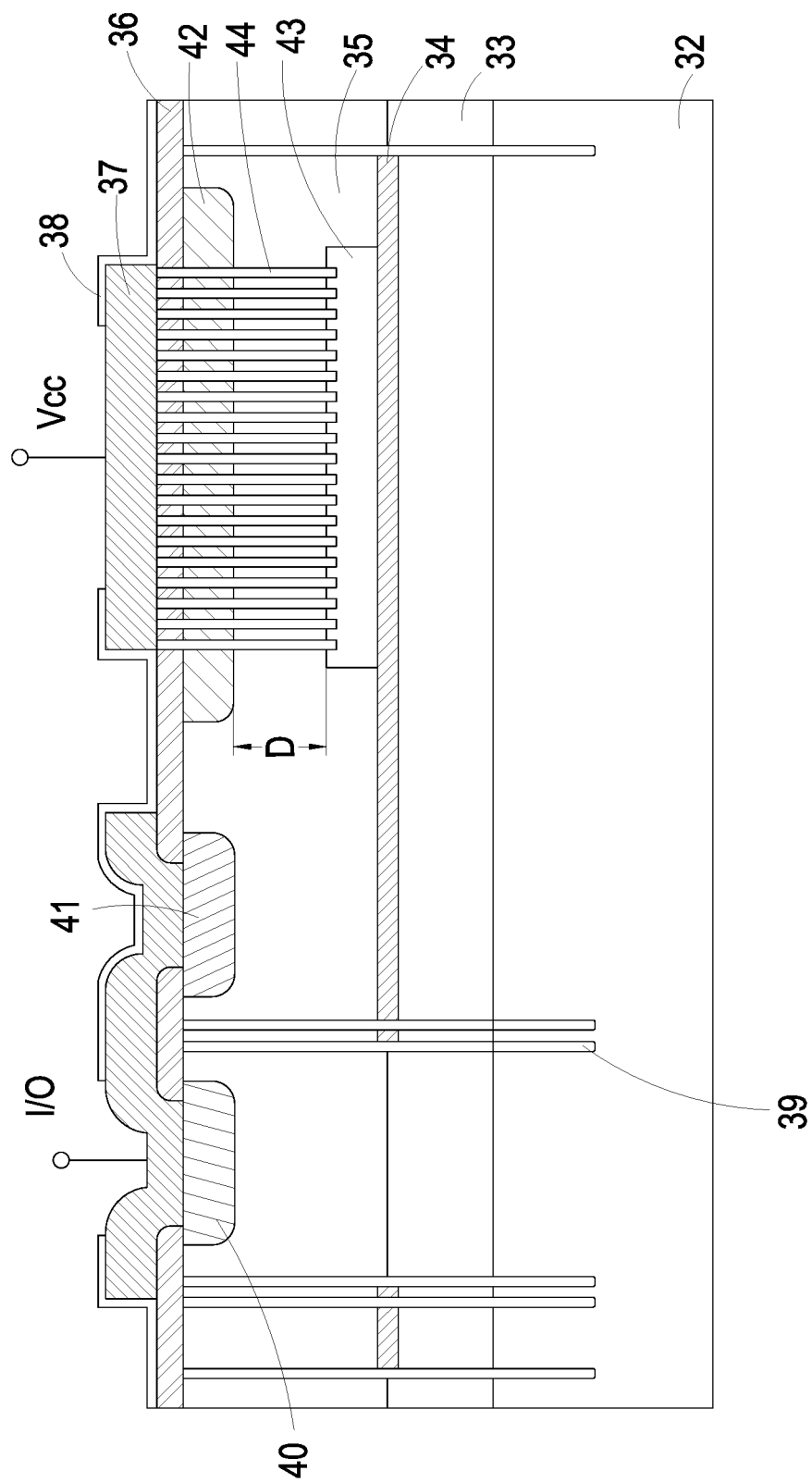

In the embodiment, the manufacturing method of the transient-voltage-suppression diode structure 3 further includes a step S10. In the step S10, a passivation layer 38 is formed and disposed on the first metal layer 37 and partially exposing the first metal layer 37 to define the working-voltage terminal Vcc and the input-and-output terminal I/O, as shown in FIG. 3I. In addition to the first metal layer 37, a second metal layer 31 is further formed on another side opposite to the first metal layer 37. The second metal layer 31 is connected to the P+ type base layer 32 of the substrate 30 and is configured to form the ground terminal GND, as shown in FIG. 2. Certainly, the forming procedures of the interlayer dielectric layer 36, the first metal layer 37, the passivation layer 38 and the second metal layer 31 are adjustable according to the practical requirement. The present disclosure is not limited thereto, and not be redundantly described herein.

In summary, the present disclosure provides a transient-voltage-suppression diode structure and a manufacturing method thereof. By utilizing a plurality of polycrystalline plugs, it is beneficial to solve the problem that it is difficult to control and increase the concentration in the transient-voltage-suppression diode structure by the general doping and drive-in procedure. The structure of the polycrystalline plugs is helpful to reduce the distance of deep implantation and avoid the problem of concentration reduction after drive-in procedure. The difficulty of the manufacturing process is reduced effectively. In addition, the structure of the plurality of polycrystalline plugs is further helpful to reduce the parasitic resistance of, for example the N− type epitaxial layer, so as to improve the performance of the transient-voltage-suppression diode structure.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A transient-voltage-suppression diode structure, comprising:
   a substrate;
   at least one N− type epitaxial layer disposed on the substrate;
   a first metal layer disposed on the at least one N− type epitaxial layer and configured to form a working-voltage terminal;
   a first N+ type implant layer spatially corresponding to the working-voltage terminal and embedded in the at least one N− type epitaxial layer, wherein the first N+ type implant layer is configured to connect to the working-voltage terminal of the first metal layer;
   a deep N+ type implant layer spatially corresponding to the working-voltage terminal and embedded in the at least one N− type epitaxial layer, wherein the deep N+ type implant layer is spaced apart from the first N+ type implant layer at a separation distance; and
   a plurality of polycrystalline plugs spatially corresponding to the working-voltage, embedded in the at least one N− type epitaxial layer, and passing through the first N+ type implant layer, wherein each polycrystalline plug comprises a first end and a second end opposite to each other, wherein the first end is in contact with the working-voltage terminal, and the second end at least partially passes through the deep N+ type implant layer and is in contact with the deep N+ type implant layer.

2. The transient-voltage-suppression diode structure according to claim 1, wherein the substrate comprises:
   a P+ type base layer; and
   an N type epitaxial layer disposed on the P+ type base layer and connected to the at least one N− type epitaxial layer.

3. The transient-voltage-suppression diode structure according to claim 2, wherein the substrate further comprises a second metal layer connected to the P+ type base layer and opposite to the first metal layer, wherein the second metal layer is configured to form a ground terminal.

4. The transient-voltage-suppression diode structure according to claim 2, further comprising an interlayer dielectric layer disposed between the at least one N− type epitaxial layer and the first metal layer.

5. The transient-voltage-suppression diode structure according to claim 4, wherein the first metal layer is further configured to form an input-and-output terminal, and the transient-voltage-suppression diode structure further comprises a second N+ type implant layer and a P+ type implant layer embedded in the at least one N− type epitaxial layer, respectively, wherein the input-and-output terminal passes through the interlayer dielectric layer and is connected to the second N+ type implant layer and the P+ type implant layer, respectively.

6. The transient-voltage-suppression diode structure according to claim 5, further comprising an N+ type buried layer disposed between the N type epitaxial layer and the at least one N− type epitaxial layer, wherein the N+ type buried layer spatially corresponds to the P+ type implant layer and the plurality of polycrystalline plugs.

7. The transient-voltage-suppression diode structure according to claim 5, further comprising a passivation layer disposed on the first metal layer and partially exposing the first metal layer to define the working-voltage terminal and the input-and-output terminal.

8. The transient-voltage-suppression diode structure according to claim 5, wherein at least one oxide isolation portion is disposed between the second N+ type implant layer and the P+ type implant layer, wherein the at least one oxide isolation portion passes through the at least one N− type epitaxial layer, the N type epitaxial layer and a part of the P+ type base layer.

9. A manufacturing method of a transient-voltage-suppression diode structure, comprising steps of:
   (a) providing a substrate;
   (b) forming at least one N− type epitaxial layer disposed on the substrate;
   (c) forming a first N+ type implant layer embedded in the at least one N− type epitaxial layer;
   (d) partially etching the at least one N− type epitaxial layer and the first N+ type implant layer to form a plurality of trenches passing through the first N+ type implant layer and a part of the at least one N− type epitaxial layer;
   (e) forming a deep N+ type implant layer embedded in the at least one N− type epitaxial layer and spaced apart from the first N+ type implant layer at a separation distance;
   (f) filling the plurality of trenches with a polycrystalline material to form a plurality of polycrystalline plugs, which are embedded in the at least one N− type epitaxial layer and pass through the first N+ implant layer; and (g) forming a first metal layer disposed on the at least one N− type epitaxial layer, wherein a part of the first metal layer spatially corresponding to the first N+ type implant layer, the plurality of crystalline plugs and the deep N+ type implant layer is configured to form a working-voltage terminal, wherein each polycrystalline plug comprises a first end and a second end opposite to each other, wherein the first end is in contact with the working-voltage terminal, and the second end at least partially passes through the deep N+ type implant layer and is in contact with the deep N+ type implant layer.

10. The manufacturing method of the transient-voltage-suppression diode structure according to claim 9, wherein the step (b) further comprises a step of:
   (b0) forming an N+ type buried layer, wherein the N+ type buried layer is disposed between the substrate and the at least one N− type epitaxial layer.

11. The manufacturing method of the transient-voltage-suppression diode structure according to claim 9, wherein the step (c) further comprises a step of:
   (c0) forming a second N+ type implant layer and a P+ type implant layer, respectively, which are embedded in the at least one N− type epitaxial layer, wherein a part of the first metal layer spatially corresponding to the second N+ type implant layer and the P+ type implant layer is configured to form an input-and-output terminal, wherein the input-and-output terminal passes through an interlayer dielectric layer and is connected to the second N+ type implant layer and the P+ type implant layer, respectively.

12. The manufacturing method of the transient-voltage-suppression diode structure according to claim 11, further comprising a step of:
   (h) forming a passivation layer disposed on the first metal layer and partially exposing the first metal layer to define the working-voltage terminal and the input-and-output terminal.

13. The manufacturing method of the transient-voltage-suppression diode structure according to claim 9, wherein the substrate comprises a P+ type base layer and an N type epitaxial layer, wherein the N type epitaxial layer is disposed on the P+ type base layer and connected to the at least one N− type epitaxial layer.

14. The manufacturing method of the transient-voltage-suppression diode structure according to claim 13, wherein the step (d) further comprises a step of:
   (d0) partially etching the at least one N− type epitaxial layer and the substrate and filling with an oxide material to form at least one oxide isolation portion, wherein the at least one oxide isolation portion passes through the at least one N− type epitaxial layer, the N type epitaxial layer and a part of the P+ type base layer.

15. The manufacturing method of the transient-voltage-suppression diode structure according to claim 14, wherein the step (d) further comprises a step of:
   (d1) forming an interlayer dielectric layer disposed on the at least one N− type epitaxial layer.

16. The manufacturing method of the transient-voltage-suppression diode structure according to claim 13, further comprising a step of:
   (i) forming a second metal layer connected to the P+ type base layer, wherein the second metal layer is opposite to the first metal layer and is configured to form a ground terminal.

\* \* \* \* \*